(12) United States Patent
Widiger et al.

(10) Patent No.: US 8,539,428 B2
(45) Date of Patent: Sep. 17, 2013

(54) METHOD FOR EXTRACTING INFORMATION FOR A CIRCUIT DESIGN

(75) Inventors: David J. Widiger, Pflugerville, TX (US); Ronald D. Rose, Essex Junction, VT (US); Sandy K. Kao, Austin, TX (US); Lewis W. Dewey, III, Wappingers Falls, NY (US); Gerald F. Plumb, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/427,516

(22) Filed: Mar. 22, 2012

(65) Prior Publication Data

US 2012/0185815 A1    Jul. 19, 2012

Related U.S. Application Data

(63) Continuation of application No. 12/415,266, filed on Mar. 31, 2009.

(51) Int. Cl.
*G06F 17/50* (2006.01)

(52) U.S. Cl.
USPC ............ 716/136; 716/105; 716/126; 716/139

(58) Field of Classification Search
USPC ................. 716/110, 112, 124, 131, 136, 105, 716/126, 139
See application file for complete search history.

(56) References Cited

U.S. PATENT DOCUMENTS

| 5,818,729 | A * | 10/1998 | Wang et al. .................. 716/122 |
| 7,530,045 | B1 * | 5/2009 | Kannan ........................ 716/101 |
| 2003/0237063 | A1 | 12/2003 | Kauth et al. |
| 2010/0251198 | A1 | 9/2010 | Widiger et al. |
| 2012/0180013 | A1 | 7/2012 | Widiger et al. |

OTHER PUBLICATIONS

"U.S. Appl. No. 12/415,266 Final Office Action", Jun. 7, 2012, 11 pages.
"U.S. Appl. No. 12/415,266 Office Action", Nov. 14, 2011, 14 pages.
Scott, Walter S. et al., "Magic's Circuit Extractor", IEEE Design & Test of Computers; vol. 3, Issue 1 Feb. 1986, pp. 24-34.

(Continued)

*Primary Examiner* — Thuan Do
(74) *Attorney, Agent, or Firm* — DeLizio Gilliam, PLLC

(57) ABSTRACT

The present disclosure is directed to a method for extracting information for a circuit design. The method may utilize an incremental extraction process for extracting information for a portion of the circuit design. Extracted results of this portion may be merged with a previously extracted result to obtain an integrated result that is equivalent to that of extracting the entire circuit design. The incremental extraction process may identify a set of changed shapes, a set of affected shapes, and a set of involved shapes for extraction. The method may also divide the circuit design into a plurality of regions, wherein two or more regions may be processed in parallel.

15 Claims, 7 Drawing Sheets

(56) References Cited

OTHER PUBLICATIONS

Xu, Qinwei et al., "Efficient Macromodeling for On-Chip Interconnects", Proceedings of the 7th Asia and South Pacific Design Automation Conference 15th International Conference on VLSI Design, Bangalore, India; IEEE Computer Society. Jan. 7-11, 2002 , pp. 561-566.

Yuan, Yanhong et al., "ICE: Incremental 3-Dimensional Capacitance and Resistance Extraction for an Iterative Design Environment", Ninth Great Lakes Symposium on VLSI; IEEE Computer Society Mar. 4-6, 1999 , pp. 64-67.

Yuan, Yanhong et al., "Incremental Capacitance Extraction and its Application to Iterative Timing-Driven Detailed", Proceedings of the 1999 International Symposium on Physical Design Monterey, CA, USA, Copyright ACM 1999. Apr. 1999 , pp. 42-47.

\* cited by examiner design shapes    circuit components

METHOD FOR EXTRACTING INFORMATION FOR A CIRCUIT DESIGN

RELATED APPLICATIONS

This application claims the priority benefit of U.S. application Ser. No. 12/415,266 filed Mar. 31, 2009.

TECHNICAL FIELD

The present disclosure generally relates to the field of computer technology, and more particularly to a method for performing parasitic extraction while maintaining valid circuit interconnectivity.

BACKGROUND

In the development of integrated electronic circuits it is important to verify proper operation before committing a design to an expensive build process. Such verifications may include extracting parasitic circuit information such as capacitance, resistance and inductance. As chips become larger and more complex, time required for performing such extractions may also increase. Therefore, for advanced processes it may be desirable to be able to incrementally extract parasitic information. That is, if a designer changed only a portion of the design and a previous complete extraction exists, it may be desirable to extract only the portion of the design that is affected by the designer's change and merge these results with the previously existing complete extraction.

A potential problem of incremental extraction is that the relationship between the incremental portion and the rest of the chip may not be preserved. For instance, if only a few shapes of a net are changed and re-extracted, knowing where to insert the changed portion into the original circuit description/netlist of the changed net may be difficult. Similarly, if the new shapes capacitively couple to the old/existing shapes, exactly where to connect in the netlist of the old shapes may be difficult to determine.

SUMMARY

The present disclosure is directed to a method for incrementally extracting information for a circuit design. The method may comprise: establishing a reflexive relationship between a plurality of design shapes corresponding to a plurality of circuit components in the circuit design; receiving a design change for at least one design shape of the plurality of design shapes; identifying a set of changed shapes, a set of affected shapes, and a set of involved shapes; extracting at least one of a capacitance, an inductance or a resistance for the updated circuit design based on at least one of the set of changed shapes, the set of affected shapes and the set of involved shapes; and updating the plurality of circuit components in the circuit design based on at least one of the set of changed shapes and the set of affected shapes.

A further embodiment of the present disclosure is directed to a method for extracting information for a circuit design. The method may comprise establishing a reflexive relationship between a plurality of design shapes corresponding to a plurality of circuit components in the circuit design; receiving a design change for at least one design shape of the plurality of design shapes; dividing the circuit design into a plurality of dies; splitting a particular design shape along a boundary of a first die and a second die when a first portion of the particular design shape is within the first die and a second portion of the particular design shape is within the second die; identifying at least one primary die based on the design change; identifying within the at least one primary die a set of changed shapes, a set of affected shapes, and a set of involved shapes based on a predetermined max coupling distance; joining the first portion of the particular split design shape and the second portion of the particular split design shape; extracting at least one of a capacitance, an inductance or a resistance for the updated circuit design based on at least one of the set of changed shapes, the set of affected shapes and the set of involved shapes; and updating the plurality of circuit components in the circuit design based on at least one of the set of changed shapes and the set of affected shapes.

A further embodiment of the present disclosure is directed to a method for extracting information for a circuit design. The method may comprise dividing the circuit design into a plurality of dies; evaluating a weight to be assigned to each one of the plurality of dies; receiving a rectangular region defining an area where information for the circuit design is to be extracted; receiving a target number of partitions desirable for the rectangular region; iteratively dividing the rectangular region into a plurality of sub-regions until a sub-target number for each sub-region is one; and extracting information for at least two sub-regions in parallel.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DESCRIPTION OF EMBODIMENT(S)

Reference will now be made in detail to the subject matter disclosed, which is illustrated in the accompanying drawings.

The present disclosure is directed to a method for extracting information for a circuit design. A circuit may include a collection of nodes and elements. Each element may be a capacitor, a resistor, or an inductor. Each element may connect two nodes. The circuit may be divided into nets. A net may represent a continuous metal path between electronic circuits on the semiconductor chip. Circuit representation of a net may be a set of nodes connected through resistance or inductive elements. A collection of nodes and connected resistors/inductors may form a net in the circuit. Each node in the net may have one or more capacitors connected to it. These capacitors may connect this node to ground or power, to another node on the same net, or to a node on a different net. Capacitors that connect to a different net may be referred to as coupling capacitors.

In one embodiment, an incremental extraction method may be utilized for incrementally extracting information of a circuit design while maintaining net interconnectivity ability. The ability to properly interconnect nets with coupling elements may be referred to as "incremental coherency". The incremental coherency may be maintained by establishing and maintaining a relationship between shapes in the wiring design and components in the extracted circuit. With such a relationship established, the method of the present disclosure may incrementally extract information of the circuit with a result equivalent to the result of a full extraction.

Figure 1:
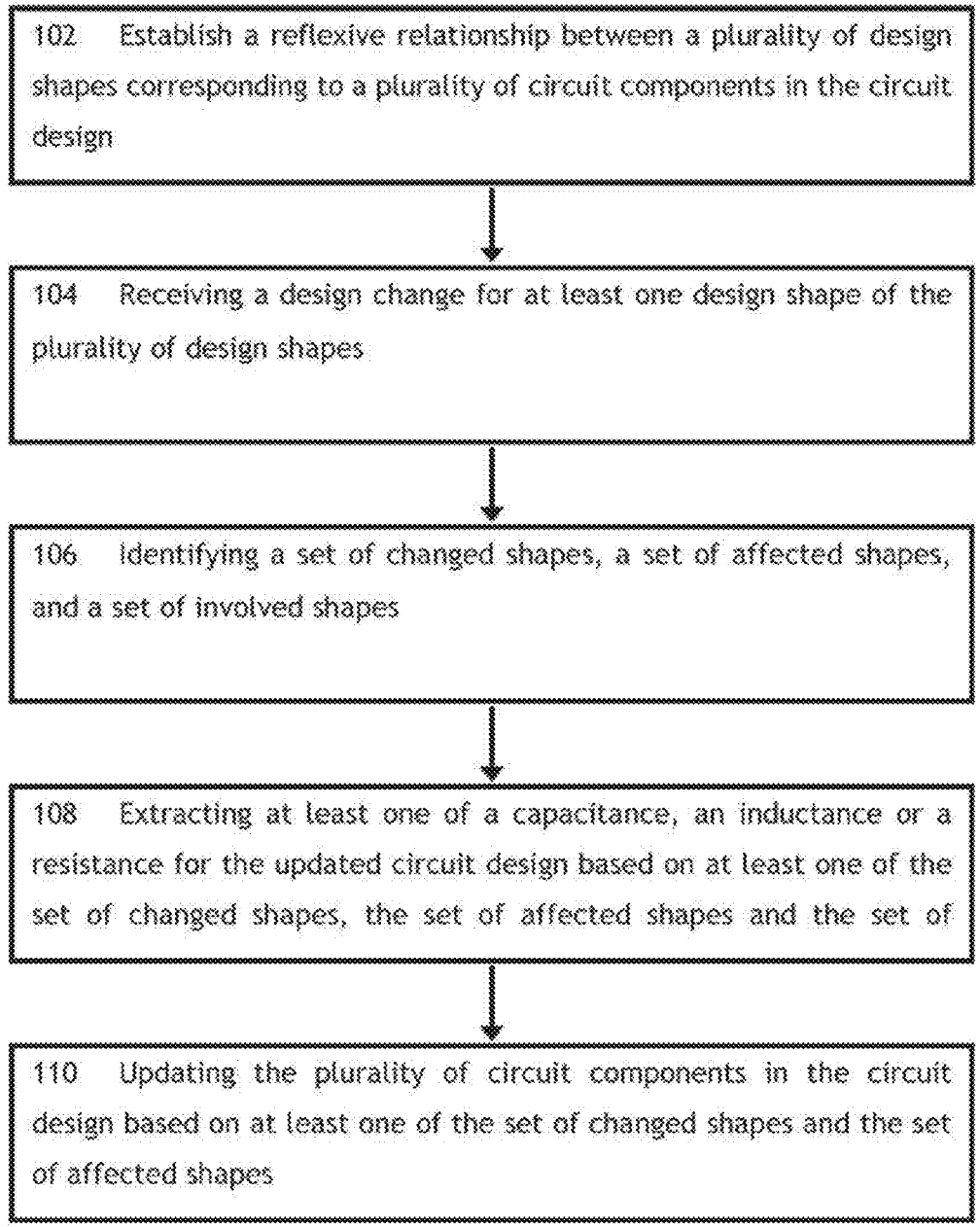
FIG. 1 is a flow diagram illustrating a method for extracting information for a circuit design.

FIG. 1 shows a flow diagram illustrating steps performed by an extraction method 100 in accordance with the present disclosure. Step 102 may establish a reflexive relationship between a plurality of design shapes corresponding to a plurality of circuit components in the circuit design. Step 104 may receive a design change (e.g., from a circuit designer) for one or more design shapes. Step 106 may identify a set of changed shapes, a set of affected shapes, and a set of involved shapes based on the design change received. Step 108 may extract the capacitance and/or resistance information of the circuit design based on the set of changed shapes, the set of affected shapes and/or the set of involved shapes. Step 110 may update the plurality of circuit components in the circuit design based on the set of changed shapes and/or the set of affected shapes. Identifying the set of changed, affected and involved shapes may reduce the design shapes that may be needed for extraction processes, thus reducing the complexity of the incremental extraction process. Extracted information based on the set of changed, affected and involved shapes may be merged with the previous extraction result to produce a full extraction result of the updated design.

Figure 2:
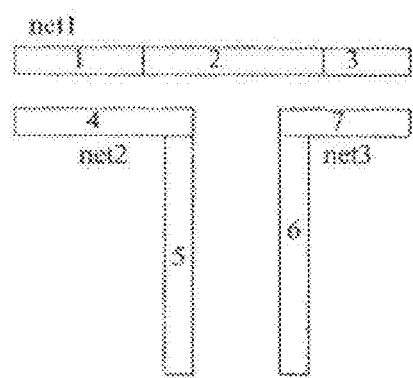
FIG. 2 is an exemplary reflexive relationship between design shapes and their corresponding circuit components.
Figure 2:
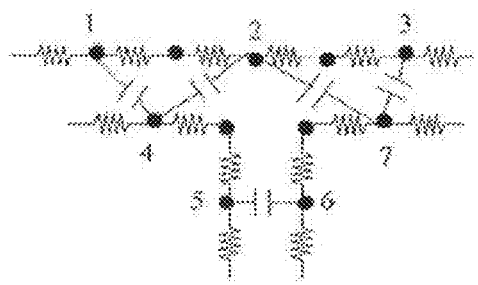

An exemplary reflexive relationship established in step 102 between design shapes and their corresponding circuit components is illustrated in FIG. 2. The numbers on the nodes and shapes are the reference ids. In one embodiment, the relationship between design shapes and their corresponding circuit components may include the following requirements.

The relationship may require that in any extraction/circuit analysis system, there is a correspondence between shapes in the design and components in the circuit. It may be required that, if a shape or a group of shapes in the design corresponds with one or more circuit components, those same circuit components correspond with the original group of shapes. That is, the relationship between the group of design shapes and the group of circuit components must be reflexive.

The above restriction does not mean that every circuit element must correspond to a shape in the design. Rather, any shape in the design whose capacitance to other shapes in the design will be represented in the circuit must, either by itself or with a group of shapes, correspond to one or more components in the circuit. A shape that capacitively couples to another shape will be referred to as a "coupling shape". FIG. 2 shows an example of this type of association: a single node (but not every node) may correspond to a single shape. It is understood that in a typical application, a single design shape may relate to a single circuit component. However, the incremental coherency process may be applied to general case as well.

The relationship may also require that an identification to be established on each coupling shape in the design. An example for assigning reference ids to shapes and their corresponding nodes is illustrated in FIG. 2. This identification (may also be referred to as reference id or shape id) may be a number, a collective group of numbers, or any abstract identification. The identification may be required to be unique for each coupling shape (or a group of such shapes) in the design. It is also required that a coupling shape's reference id remains the same value as long as that shape is not changed. For example, if an incremental design change takes place that does not involve a particular shape, this shape will retain the same reference id as it had before the change.

An example of a reference id may be the coordinate pairs defining the shape, the metal level of the wire (represented with a number), and the net to which the shape belonged (represented with a number). This collection of numbers may remain unchanged unless that shape itself is changed. Another example of a reference id may be an integer number kept in an associative array object representing the shape coordinates, metal level, and containing net. Still another example of a reference id that may require less memory may be a unique integer number assigned to each shape.

[The relationship may further require every node in the circuit that has a corresponding shape in the design to have a reference id identical to the reference id of the corresponding shape. As illustrated in FIG. 2, not all nodes are required to be associated with a shape in the design, but each coupling shape in the design must be associated with some node.

For example, a way for rendering such an association may be by forming a so-called T network from each design shape. Such a network may include two resistors, each with an end connected to a central node, and the other end connected to a neighboring T network. All capacitors to either ground or other points in the circuit may be connected to the central node. In this configuration, the central node may be associated to the shape with the reference id. The exemplary circuit in FIG. 2 is an example of a T network representation.

In more general configurations, another way of rendering the association may be by forming a so-called pi network from each design shape. Such a network may include a single resistor whose ends connect to a neighboring pi network. Capacitors from the associated shape to ground or other locations in the network may be rendered as two capacitors connecting to the two ends of the single resistor. The capacitance value may be apportioned between the two rendered capacitors (e.g., half to each). In this case, the resistor element may be associated to the shape with the reference id. It is contemplated that a shape may be represented by an unlimited circuit complexity. In general, a node, an element, or a more abstract collection may be associated with a shape. In the latter case, a rule may be established for connecting coupling capacitors to that network.

Upon receiving a design change for one or more design shapes in step 104, step 106 may identify a set of changed shapes, a set of affected shapes, and a set of involved shapes based on the design change. For instance, when the designer changes one or more shapes in the design, then the affected parts must be re-extracted. The affected parts may include the changed shapes, the shapes these changed shapes formerly or currently connect to, and any shapes within the vicinity of the old or new locations of the changed shapes. A changed or moved shape may be thought of as comprising two steps: removal of the existing shape, and addition of a new shape. The shape before removal may be referred to as a "ghost shape" and the shape after addition may be referred to as an "added shape".

Figure 3:
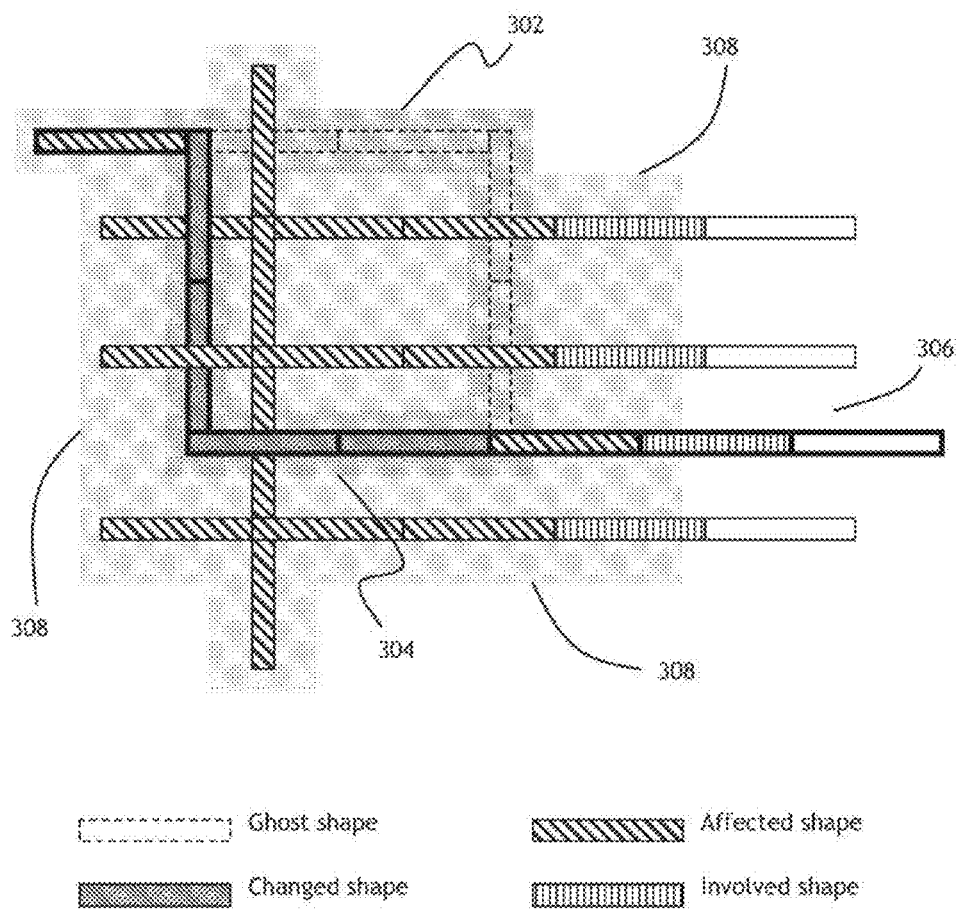
FIG. 3 is an illustration of an exemplary circuit design change.

An exemplary design change is illustrated in FIG. 3. In this example, shape changes are made to net 306 while other nets in the circuit design remain unchanged. The changes to net 306 may include removing (indicated as ghost shapes in the figure) and adding (indicated as changed shapes in the figure)

multiple shapes. The terminology "halo around a shape" may be used to refer to the region around a shape such that the capacitance or inductance of any neighboring shape within that region has the potential of being affected by the changing shape. For an incremental design change, the union of halos 308 including the halos of the set of ghost shapes 302 and the halos of the set of added shapes 304 may constitute the area with which any intersecting shape may have the potential to have its capacitance properties changed and hence must be re-extracted. This union of halos 308 is a superset of the incremental halo of the ghost shapes 302 and the incremental halos of the added shapes 304.

In one embodiment, the shapes involved in the incremental extraction may be classified into three groups. Shapes that have actually changed may be marked as "changed", shapes intersecting the incremental halo but not changed itself may be marked as "affected", and shapes intersecting the union of the halos of all the affected shapes and have not been marked as changed or affected may be marked as "involved". Only the shapes in the above three categories need be retrieved from the design for incremental extraction. This set of shapes may be referred to as the "incremental basis" shapes. FIG. 3 shows examples of the changed (including ghost), affected, and involved shapes as well as halos. The bold shapes in FIG. 3 indicate the target net 306 (net that has been changed), shapes within the halo of the changed and ghost shapes are affected shapes, and shapes within the halo of the changed shapes are involved shapes.

Step 108 may extract the capacitance and/or resistance information of the circuit design based only on the changed, affected and/or involved shapes. For the incremental extraction method of the present disclosure, extraction of all capacitances between shapes in the incremental basis may provide the capacitance information needed to achieve incremental coherency in the resulting circuit. In one embodiment, changed and/or affected shapes may have their capacitances re-extracted, and involved shapes may only have their capacitances to affected shapes re-extracted. The incremental coherency process may retain any capacitance of involved shapes to other involved shapes, but replace, remove, or add capacitances only to affected shapes. It may not be uncommon that the capacitances from involved shapes to affected shapes may not change as the result of an incremental wiring change.

In one embodiment, the capacitance extraction process may operate only on the incremental basis shapes. For example, only coupling capacitors involving either changed or affected shapes may need to be extracted. Such capacitances may be to another changed or affected shape, or to an involved shape. Capacitances from the involved shape to the affected shape are not calculated, rather, the value from the old extraction may be reused. This is proper and accurate since the environment of shapes used in the capacitance analysis of the involved shape has not changed. Each of the two nodes of each extracted capacitance may be identified based on the corresponding shape in the design using the reference id of the shape.

Inductance information of the changed design may also be obtained in a process similar to the process for obtaining capacitance information. Resistance information of the changed design may also be obtained. For example, one approach may be to re-extract the entire resistance network for nets with changed or affected shapes. This approach may be utilized when the use of the old circuit representation of resistance does not easily combine with the resistance extraction of the changed shapes. In this approach, the results of the combined old and new capacitance extractions may be organized into groups of shapes per net. Only the groups containing changed or affected shapes may be retained and processed utilizing a conventional resistance extraction method for each net. These nets may then be removed from the old circuit representation (e.g., physical removal or mark/flag such nets as removed).

Another approach for obtaining resistance information may be to reuse as much of the resistive network from the old circuit representation as possible. For nets with only affected shapes, the resistive network may be used intact. For nets with changed shapes, the portions of the circuit corresponding to removed shapes may be removed and new circuitry corresponding to new shapes may be added. With the resistive network in place, the capacitance may be processed with the following flow: removing the capacitances of all changed or affected shapes, and adding the capacitances determined during the incremental capacitance extraction to proper nodes in the circuit corresponding to the affected or changed shapes. The reference ids (shape ids) may be utilized for locating components in the circuit corresponding to the changed shapes.

In one embodiment, the resistance extraction may take place only for the changed shapes in the design. The resistance of affected and involved shapes need not be recalculated since these shapes did not physically change. Likewise, the resistance portion of nets without changed shapes does not change. Each node or group of nodes corresponding to a changed shape may be identified utilizing the reference id of the changed shape.

For example, the process of determining resistance and creating a circuit representation may be performed by finding the touching shapes (shapes that form an electrical connection between them). Once the touching shapes are determined, the resistance may be determined. For example, for simple rectangular shapes, the resistance may be determined as the per-length resistance multiplied by the length. More advanced algorithms may also be utilized for resistance determination. For example, the collection of shapes may be taken together into an analysis that may properly calculate the effects of turning corners, T-junctions, etc.

Utilizing the reference ids (shape ids), points in the circuit corresponding to points in the shapes of a net may be tracked. Moreover, because of the strict preservation of the shape id on unchanged shapes in this process, the correspondence is guaranteed to exist between the set of shapes of the old design and the circuit representation of the old design. Similarly, the set of removed shapes may also be determined. Thus, utilizing their shape ids, the parts of the old circuit representation to be removed may be identified. In addition, the set of shapes from the old design representing a net may be analyzed with the new shapes for that net to determine which shapes from the old design touch the new shapes. Therefore, it may be determined precisely where the new portion of the circuit is to be placed in the circuit from the old design. Thus, the components in the circuit design corresponding to the changed shapes may be identified, and the resistance may be extracted based on the changes.

Step 110 may update the plurality of circuit components in the circuit design based on the set of changed shapes and/or the set of affected shapes. Based on the relationship and the reference ids established between design shapes and their corresponding circuit components, capacitance extracted in the incremental basis may be placed into the circuit between precisely the proper nodes. It is contemplated that a re-extraction utilizing the incremental coherency process of a region not in the vicinity of a change would reproduce the exact original capacitive values and connectivity.

In one embodiment, based on the relationship and the reference ids established between design shapes and their corresponding circuit components, the update process may first remove all circuit components corresponding to shapes that have been deleted. Then the update process may insert the resistive components of the resistance extraction into the circuit. The update process may then remove all capacitors of shapes marked as affected (the capacitors to shapes marked as changed may have been removed in the first step already).

The update process may also add the capacitors from the capacitance extraction into the circuit. The two nodes to which to attach the capacitor may be identified by the reference id associated with them. A mechanism, such as an associative array, may be used to identify the node in the circuit corresponding to a particular reference id. The two reference ids attached to each capacitor may then be used to locate the two nodes to which to attach the capacitor. In cases where a capacitor may connect to several nodes, a mechanism may be utilized for identifying the set of circuit components associated with a reference id. Such a mechanism may also be implemented as an associative array.

It is contemplated that the capacitance and/or resistance extracted according to the extraction method 100 may be merged/integrated into the existing result of the old circuit design. The integrated result will be equivalent to that of extracting the entire chip.

It is understood that an extraction process may have the characteristic that its calculation of coupling capacitances is asymmetric. That is, shape A's coupling to shape B may be calculated to be different that shape B's coupling to shape A.

Asymmetry may be due to many factors. For instance, the shape environment to the other side of A from B may affect A's view of B. When calculating at B, however, such environment shapes may be sufficiently far from B so as to be ignored by the extraction algorithm. In another example, the smaller capacitances on A may be coalesced into a single capacitance for the purposes of saving memory. When B is processed, however, the same capacitance may not be considered sufficiently small to be coalesced. The situation where two capacitances are extracted that is potentially different may be referred to as a bi-asymmetric case. In still another example, the extractor may compute capacitances to non-circuit shapes (such as power or ground) only at the circuit shape, which may lead to a one-sided asymmetry. Such situations may be referred to as uni-asymmetric.

The circuit representation of such capacitance situations may average the two bi-asymmetric capacitances to form a single coupling capacitor and using the uni-asymmetric capacitances as-is. Alternatively, each individual capacitance may be memorized, and the one from the more favored net may be used when an actual circuit is needed for simulation.

It is contemplated that the incremental extraction method 100 may be refined to work with the restrictions of such an extractor and avoid performing capacitance extraction for involved shapes. In one embodiment, the refinement process may require that both capacitors in a bi-asymmetric capacitance situation be retained in the circuit database. It may further require that such capacitors in the circuit be marked as to which end connects to the shape from which it was extracted.

The refinement process may then specify that, when removing capacitors of affected shapes, the capacitances from involved to affected shapes be retained (but capacitances from affected shapes to involved or changed be removed in the normal way). The refinement process may further specify that, for the case of affected/involved couplings, only the capacitances from affected shapes to involved shapes be inserted into the circuit. The other steps may proceed as previously described with the uni-asymmetric and bi-asymmetric capacitance representations in the circuit.

It is understood that the representation of two capacitors, one for each direction, in the bi-asymmetric case may be implemented in several ways. Exemplary implementations may be an actual presence of two capacitors, each designated with the direction to which it pertains, or a single capacitor with multiple values each designated with a direction.

The incremental extraction method 100 may also be refined to work in situations where a complete extraction of a changed net may be necessary. A complete extraction of a changed net may be necessary in certain situations. For instance, it may not be feasible to perform a resistance extraction only on the changed shapes. If so, the resistance extraction may take place for all the shapes in the net with a change. This may be the case if a complicated network is used to represent a wire or a wiring via, or may be the case if network reduction or expansion (distribution) takes place.

It is understood that, even though the resistance extraction may be performed on an unchanged shape, its ultimate circuit representation would be the same. This procedure may require that its reference id be the same as before the change. Therefore, it is clear that the capacitance extraction may take place with the same halo and shape identification as before. The coupling capacitors in the circuit that connect to the unchanged part of the changed net may be removed and remembered (e.g., both the value and the reference id of each end). Then the entire circuit of the changed net may be removed and the resistance-extracted network may be inserted. Then the previously saved capacitors may be put back into the circuit based on their reference ids. The procedure then goes as previously described. The connection of the capacitors may be the same as before because of the restrictions placed on the reference id usage.

It is also contemplated that the extraction method 100 may be further refined for improving extraction efficiency by reducing the halo of affected shapes. The shapes in the incremental basis may be more than necessary for incremental extraction. This may be because the size of the shapes may be significantly longer than the distance used to define the halo. There may be couplings far from the halo union of the changed shapes that it would be clear the capacitance values would not change. Thus unnecessary extraction may be reduced to further improve efficiency.

Figure 4:
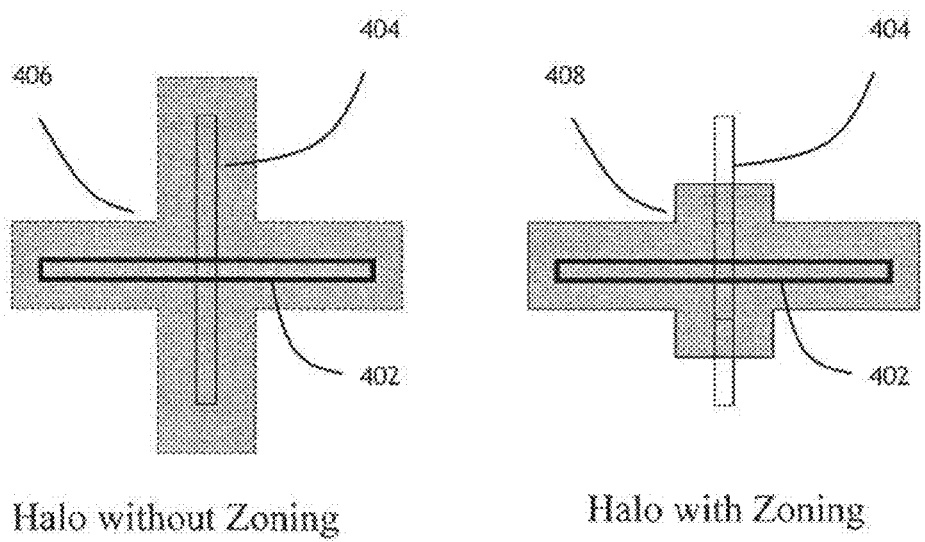
FIG. 4 is an illustration of a zoning technique.

The incremental extraction method 100 may be refined to reduce the incremental basis without forcing a smaller shape size. A process referred to as "zoning" may be utilized. As illustrated in FIG. 4, a changed net 402 and an unchanged (but affected) net 404 may form a union of halos 406 without zoning. However, not all shapes of net 406 may be necessary for re-extraction. For example, if a shape in net 406 is sufficiently far from the changed net 402, this shape may be excluded from the union of halos.

Utilizing the zoning technique, each shape may be divided into multiple "zones" having length comparable to the halo distance. For each capacitance that is extracted, in addition to a reference id associated with each of its two wires, may also have a zone identification for each zone within the shape. When shapes intersecting the halo union of the changed shapes are identified, the zones of those shapes that intersect may also be noted. Only the noted zones 408 may be utilized for creating the affected shape halo for identifying involved shapes, and only capacitances to those zones may be extracted. The circuit representation may be similar as previously presented, except that any coupling capacitor may now be represented by possibly many capacitors in parallel. Only capacitors to or from affected zones may be removed and replaced during the steps of the incremental coherency process.

When the zoning technique is employed, the number of shapes in the design and the number of nodes in the circuit representation may remain the same. The number of capacitors, however, may increase. For the purpose of circuit simulation, since the increased number of capacitors is mostly capacitors in parallel, they may be formed into one capacitor, resulting in the same complexity circuit simulation as was before the refinement.

Figure 5:
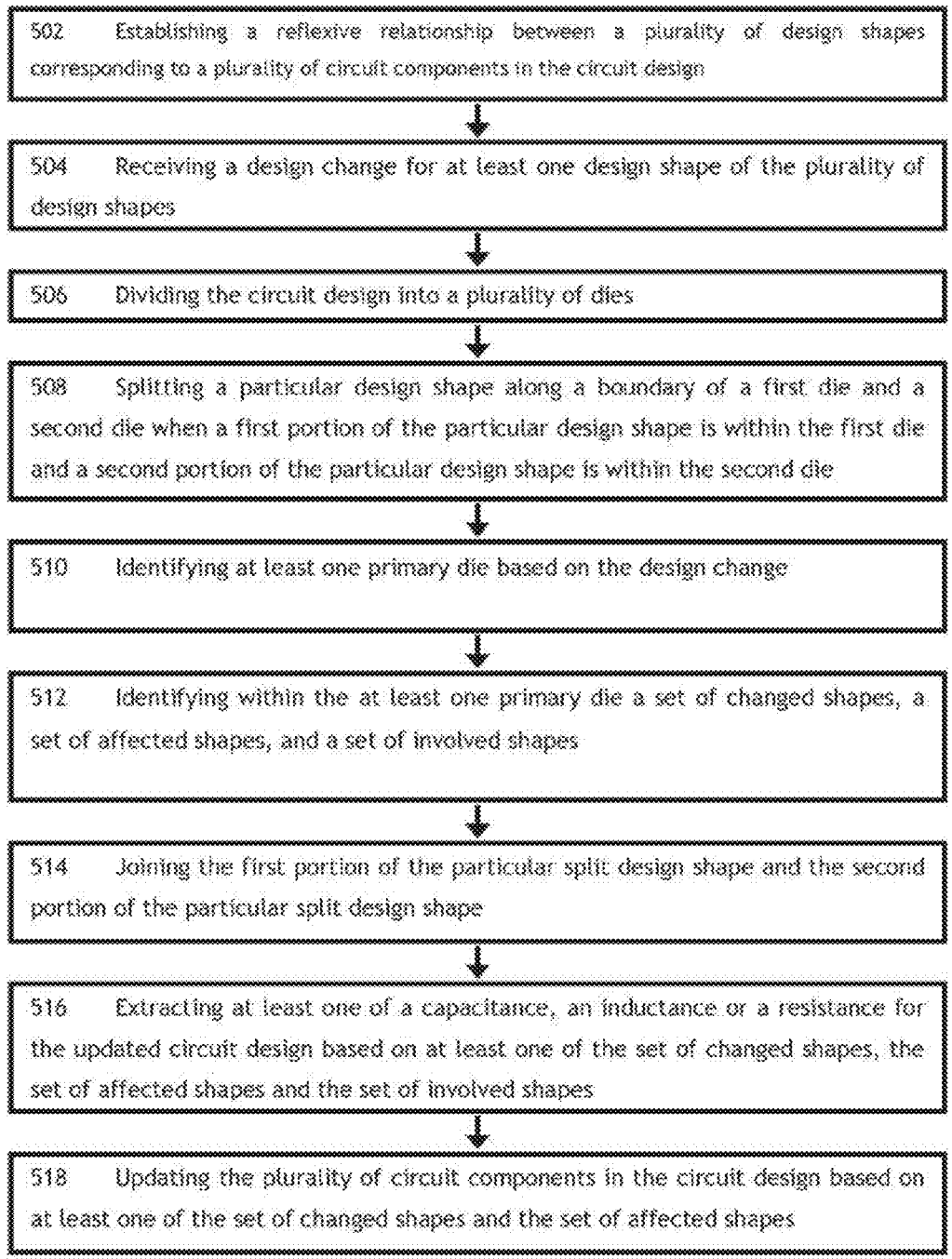
FIG. 5 is a flow diagram illustrating another method for extracting information for a circuit design.

Alternative steps may be utilized for identifying a set of changed shapes, a set of affected shapes, and a set of involved shapes based on the design change. FIG. 5 shows a flow diagram illustrating steps performed by an extraction method 500 in accordance with the present disclosure. Step 502 may establish a reflexive relationship between a plurality of design shapes corresponding to a plurality of circuit components in the circuit design. Step 504 may receive a design change (e.g., from a circuit designer) for one or more design shapes. A die-based process comprising steps 506 through 514 may be utilized for identifying changed, affected and involved shapes. Step 516 may extract the capacitance, inductance and/or resistance information of the circuit design based on the changed, affected and/or involved shapes. The extracted information may be merged with the previous extraction result to produce a full extraction result of the updated design. Step 518 may update the plurality of circuit components in the circuit design based on the set of changed shapes and/or the set of affected shapes.

In one embodiment, the die-based process may divide the circuit design (chip) into one or more dies in step 506, and extract only the dies that contain changes or are near shapes that have changed based on a max coupling distance. A die may be a square or rectangular area of the chip of a predetermined size. The size of the die may be chosen small enough to minimize the area identified as needing extraction, but large enough so that reasonable extraction events may be considered and splitting of shapes may be reduced. The die-based process may include obtaining a flat representation of shapes for both the old (existing design) and the new (changed design). The old extraction results may be saved from a previous analysis. The two representations may be compared for changed shapes, new shapes, missing shapes, renamed shapes, repositioned or re-defined instances, and macro data that may have changed. Based on these differences, a map may be created indicating which dies are to be re-extracted. It is contemplated that the shapes in the old and new designs may be sorted to facilitated comparison. Sorting of shapes may be based on shape coordinates, metal levels, and/or net information.

A design shape may extend across multiple dies. For example, if a long shape has a first end located within a first die, and a second end located within a second die, and if the touching shape at the first end changes, the extraction algorithm may cause the long shape to be split down its length, thereby affecting the extraction algorithm's overlap removal process regarding the touching shape at the second end. This may cascade to other touching shapes, and as a result, including dies that may not be necessary for incremental extraction. To keep the cascading effect under control, step 508 may split a particular design shape along a boundary of a first die and a second die when a first portion of the particular design shape is within the first die and a second portion of the particular design shape is within the second die. Therefore, all shapes may be split at die boundaries, and overlap removal may not be allowed to propagate across die boundaries. A die is the fundamental area on which the area-based incremental process takes place. In one embodiment, the splitting of shapes happens before comparing the old and new designs to determine changes, necessary to contain changes from propagating beyond die boundaries.

A user-defined distance referred to as the "max coupling distance" (MCD) may be utilized for determining the changed, affected and/or involved shapes. The MCD may define the distance beyond which capacitive coupling is ignored and may be different depending on the metal level involved. If different MCDs are utilized for different metal levels, the largest of all the metal levels may be selected/utilized. A shape within the MCD of a changed shape, or within the MCD of its previous location, may be classified as an affected shape. Shapes within the MCD to an affected shape that are not already classified as affected or changed may be classified as involved. Different MCDs may be defined for different wiring layers.

For a die-based incremental process, the process of assigning changed, affected, or involved may not be optimum, but will guarantee that there is no missing re-extraction. A set of dies may be chosen whose contents will include all changed and affected shapes. The process of choosing these dies is to choose the set of dies that overlaps any halo of any changed shape or ghost shape, where the halo of a shape is the shape extended on all sides by the MCD. This process will guarantee that all true affected shapes are included by marking all shapes within this set of dies as affected (if not already marked as changed). The set of such dies is referred to as primary dies. The involved shapes then belong to the dies that are adjacent to the primary dies. Such dies are referred to as secondary dies, and the shapes within such dies are marked as involved shapes.

The primary dies and the secondary dies may be identified in step 510 according to the above description. Step 512 may identify within the primary and secondary dies the changed, affected and/or involved shapes. It is contemplated that a shape that is not within a specified distance (e.g., two MCDs) to a primary die may be discarded. It is also contemplated that step 510 may record a map of the primary and secondary dies (die map) in a memory or a file for future references (e.g., to facilitate identifying the shapes based on the die map). The largest shape id utilized may also be stored for subsequent shape id assignments.

Once the shapes to be re-extracted are determined, step 514 may join the split design shapes back again. The split design shapes are joined back to avoid errors in extraction. In one embodiment, the split shapes are rejoined before the update step 516 and extracting step 518. At this point, the die-based process for identifying changed, affected and involved shapes is complete, and the remaining steps of the extraction method may be processed as previously described.

The steps of splitting (step 508) and rejoining (step 514) shapes that cross die boundaries may be further explained. In one embodiment, the splitting step 508 happens for any shape that overlaps a die boundary. The splitting helps in preventing possible anomalies in an overlap removal process from propagating. For example, the split may be a length-wise splitting of a narrow shape. Width-wise splitting of long shapes may be desirable to incorporate distributed effects in the resultant network, where a shape typically resolves into a network component. However, length-wise splitting can lead to errors in some extraction engines. Therefore, shapes split along their length before the comparison and overlap removal may need to be rejoined before extraction.

In one embodiment, the criteria chosen for whether to rejoin shapes for extraction may be based on the shape's width. For example, any shape that extends more than one MCD on both sides of the die edge may not be rejoined. The chosen criteria, however, may be more general. Having such a limit ensures that only abnormally wide shapes split along their length may not be rejoined using this algorithm and extraction errors due to such wide shapes being split would be minimal.

By joining narrow shapes split along their length, the rejoined shapes may inherit some of the properties of the original shapes. This includes the changed or affected status of the shapes. If the die boundary separates an affected shape and an involved shape, the rejoined shape may become either affected or involved. In one embodiment, the decision may be based on which die the rejoined shape is mostly in, though any equivalent solution that limits the maximum extension of a shape into a neighboring die may also be utilized. Based on the die that is selected, the properties of the portion of the shape within the selected die are the properties of the rejoined shape. In the case of a tie, a predetermined portion (e.g., left or bottom) of the shape may be chosen to control. This algorithm may also ensure that a changed or affected shape may not extend more than one MCD into a potentially non-primary die.

As a result of the joining process, it may be possible for changed or affected shapes to extend outside the boundaries of the primary dies. Consequently, in one embodiment, to ensure that the involved shapes are included, the boundary for which to include involved shapes may be set to two MCDS: one MCD for how far an affected shape may extend into a secondary die and one MCD for its farthest coupling to an involved shape. It is understood that the criteria above may be generalized. If the width extending into the die is increased, then the halo for considering involved shapes may also be extended.

In one embodiment, flags may be attached to the split shapes to facilitate splitting and rejoining. For example, two flags may be utilized: "split-x" and "split-y", indicating that a rejoinable split happened either on the x or y axis respectively. The rejoining process may examine the flags on a shape and join the shape accordingly. For the purposes of rejoining split shapes, two flags on each shape may be examined, split-x and split-y, which indicate that the original shape was split under conditions that warrant rejoining later. It may be necessary to have two flags since there may be cases where a single shape has edges touching both a horizontal and a vertical split line making it unclear as to which edge is to be joined.

It is contemplated that upon identification of the changed, affected and involved shapes, the die-based extraction method 500 may be refined to process in parallel to improve extraction efficiency. In one embodiment, a process may be established for arranging primary dies into groups. While an arbitrary grouping is acceptable, a process which collects clustered primary dies may be preferable since the cost of extraction would be reduced. Each collection of primary dies may be destined for an independent parallel extraction. Given one of these collections of primary dies, a set of secondary dies may be determined as any primary or secondary die adjacent to any die in the collection. Each shape in the collection of primary dies may be marked as "extractable" to distinguish it from potentially other shapes marked as changed or affected in primary dies converted to secondary dies. As a refinement, the changed or affected flags may be utilized for this purpose, perhaps clearing them for the uses of the die as a secondary die to a collection.

The dies which are secondary to such a collection may then be trimmed of all shapes not within two MCDs of a neighboring die in the collection. The set of shapes consisting of shapes in the collection of dies and the shapes in the trimmed secondary dies may be sent to the extraction engine for the extraction of one of the many parallel parts. The extraction engine may then extract capacitance or inductance only for shapes marked as extractable. Thus, among all the parallel pieces, no shape will be extracted in more than one partition. The output of the extraction task may include only the extractable shapes, and may be re-combined into a single result.

Special care may be needed for extracting inductance in parallel since it may typically depend on power and signals extending considerably farther than the capacitance MCD. This may be accomplished by including possibly several secondary dies in the appropriate directions. This represents only a trivial amount of extra extraction processing since no inductance need be extracted on the shapes outside the primary die group.

In one embodiment, partitioning for parallel execution may be performed immediately after the rejoining step. Shapes with an "extractable" flag marked in a particular parallel partition may have their capacitance and inductance extracted in that partition's parallel extraction. Shapes without the flag will not be extracted. For a given shape, there may be several parallel partitions to which it is destined, but for only one of these partitions should the shape be marked as extractable. Therefore, only one capacitance or inductance extraction may take place for this given shape. In the case of incremental extraction, the shapes in the secondary dies will not be marked "extractable" in any parallel partition.

The general process of the rejoin/parallel partitioning stage is to read the input shapes and apportion each to the files of the appropriate parallel partition. During this process is when the rejoining of split shapes may take place. The capacitance and resistance extraction steps may not operate properly if shapes are split along their length. Therefore, such split shapes must be rejoined.

As the input shapes are processed, each shape that is marked as split (with the split-x or split-y flag) may be collected into groups associated with a corresponding die boundary or, for shapes split in both the x and y directions, a corresponding die corner.

In one example, the corner collections may be processed first. The items in the collection are scanned and the appropriately aligned ones chosen for rejoining. In the case of the corner collections, there should be groups of four aligning shapes. The rejoined shape is then placed in the list of shapes for the appropriate parallel partition. If all of the dies participating in the rejoin are not primary, then a decision may be made as to which die the shape belongs. The rule may be chosen so that whichever shape the die extends into the most controls. In the case of a tie, a specific portion (e.g., left, right, top or bottom) may control. Whether the shape may be marked "extractable" may be determined based on the die to which the shape belongs. Upon completion of the corner shapes, the boundary groupings may be processed. The process may be similar to the corner process, except that only two shapes and dies may be involved instead of four.

Because overlap removal may have been run on the shapes since the time they were split, it may be possible that the components of the split groupings do not align; that is, their coordinates on the die boundary where they join may not be the same. In such a case, rejoining these shapes may require additional attention. A general rule may be that all possible splitting options may be considered, and the one resulting in the least increase in perimeter may be chosen. Typically, for longer shapes, this means that the ends of the shape that extend beyond the paired shape may get split off; the remaining long pieces may be in alignment and may be joined.

The process of parallel partitioning may take the set of primary dies and apportion each to a particular parallel partition. For any particular parallel partition, shapes under that partition's primary dies may be marked extractable while those outside may not be marked, even though they may be under a primary die of another parallel partition. For inductive partitions, extra dies may need to be included as secondary dies in order to insure the proper range in which to examine for returns.

It is contemplated that upon incrementally extracting information for the circuit design, the extraction method 500 may further comprise a step for merging the results of the incremental extraction with the previous extraction results. The merge result may be equivalent to a full extraction result for the new design. In addition, the old design results and the new incremental results may be displayed together with a merge compare. Though the compare process may not be necessary for merging the results, it may help a circuit designer to determine the capacitance delta (change).

To provide merge compare, the method may find the corresponding old and new shapes and compare their capacitances for changes. Each shape from the old design result may be compared to the die map created/stored from prior steps. In determining the total capacitance change on a net, it may not be sufficient to just examine the total capacitance of the net since changes may have occurred where capacitance to one neighbor has decreased while capacitance to another neighbor has increased. In addition, capacitance on a net may move from one part of the net to another, leaving the total cap the same but ultimately exhibiting different behavior when the resultant circuit is simulated. Consequently, the capacitive changes may be determined as follows: if a shape is unique to the new result or if the shape is unique to the old result, then its total capacitance gets accumulated into the capacitance change for its net; if a shape exists in the old and the new results, then the components of that capacitance, the capacitances to individual neighboring shapes, are examined, and the absolute value of any capacitance component differences are accumulated into the capacitance change for its net.

Utilizing this process, both changes in where a capacitance goes, and where a capacitance is on the net, may be reflected in the net's capacitive change comparison.

Alternatively, the capacitive changes may be determined as follows if the capacitance needlessly fluctuates between the unchanged shapes in the old and new designs for various reasons: record the total capacitance of each net based on the old full chip result input; for old shapes within the primary dies, record the total capacitance to each component (e.g., a particular net, power or ground, etc.) detected (the sums of all capacitances to each component comprise the result); for new shapes within the primary dies, record the total capacitance to each component detected; for each net that has results in the previous two steps, go through each component and sum the absolute value of the difference in the component capacitances between old and new.

It is also contemplated that the extraction method 500 may track the properties of the shapes (such as net names and/or pin names, etc). For example, a shape may have an integer index that references a table of net names. In such a case, the existing mapping of the old design during the incremental process may need to be preserved. This may be accomplished by adding objects to a corresponding name table. The name table may be configured to not remove record even though the object (i.e., net name) may no longer exist in the new design. It is understood that if an object no longer exists, a process for marking the object as invalid may be put in place.

It is further contemplated that the extraction method 500 may be configured for performing global wiring analysis. For global wiring analysis it often may be the case that devices and small collection of devices (macros) be treated separately; the extraction tool may see only pins and some abstract shapes representing the macro, though in general the shapes representing the macro may be the exact shapes of the macro design. The design seen by the extraction process may include global wiring and various instances of a set of macros. An individual macro may be placed multiple times in a design. The extraction method of the present disclosure may be configured for including such feature into the incremental process. The extraction method may determine whether any macro placement has been moved, removed, or added; and whether any macro abstract representation has changed.

In one embodiment, the method may obtain a list of placed macros (instances) and the location and orientation of their placement. The list may be compared to the original design to determine a list of instances to be removed and instances to be added. The method may also determine the region of a macro (i.e., the region within which all abstract macro shapes are contained, e.g., bounding boxes). For example, the list of removed and added instances may be used to locate each instance's bounding box. The dies that intersect or are within a MCD of any such bounding box may be marked as primary dies. In this way, any effects of changing or moving macro instances on extraction may be taken into account. This list of primary dies may be merged with the list determined by new or removed shapes described earlier. The result may be used to identify the secondary dies.

In addition, each macro's pins and abstract shapes may be compared between new and old designs to determine if the macro itself has changed. The process for performing this comparison may be identical for that used for determining the set of removed and added shapes of the design. In this way, the set of removed shapes and the set of added shapes may be determined. If a macro is determined to have changed, then the bounding box of each instance of that macro may be used to identify additional primary dies. A further refinement may be to use the list of added and removed shapes of the macro to define a possibly smaller region of change resulting in a possible reduction of work for the incremental extraction. This may be the case for a large macro that had only a small change. The individual shapes may be utilized for determining additional primary dies.

In addition to incremental extraction method, another technique for improving performance of parasitic extraction on chip wiring is to sub-divide the problem by area into smaller regions and independently (e.g., in parallel) perform extraction on each smaller region. The subdivision may be performed by slicing the chip into regions with horizontal and/or vertical slices. Such an approach to subdivision may work acceptably as long as the distribution of wiring is even over a chip. However, there may be scenarios where the distributions may not be even. Therefore, an extraction method is proposed in the present disclosure that may provide a near-optimal partitioning of irregular extraction regions. The extraction cost of each partition is near even and grouping of neighboring portions of the design are kept together better than traditional partitioning methods.

Figure 6:
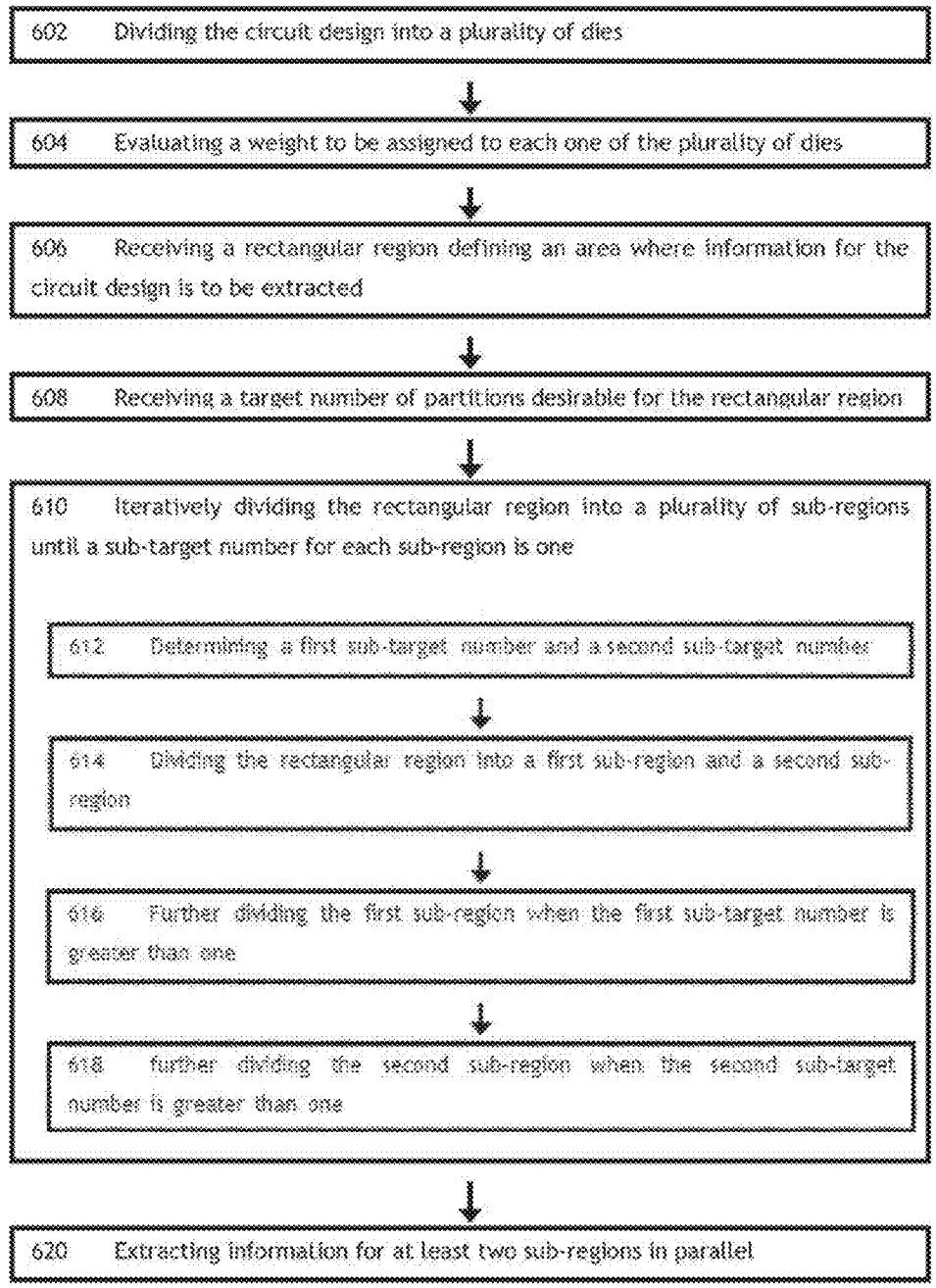
FIG. 6 is a flow diagram illustrating still another method for extracting information for a circuit design.

FIG. 6 shows a flow diagram illustrating steps performed by an extraction method 600 in accordance with the present disclosure. Step 602 may divide the circuit design into a plurality of dies. A design shape will be considered as belonging to a particular die. All dies may be the same size and organized in a grid. A given shape must be either entirely within the die or extend outside the die by only a pre-specified limited amount (an amount preferably less than the die size). The pre-specified limited amount may be referred to as the max extension distance (MXD). While the extraction method 600 works for long extensions outside the containing die, the efficiency is attained only if a restriction of extensions is enforced. Excessive extensions may cause the algorithm to include more surrounding dies in each partition than would normally be necessary. It is understood that extensions to the method to accommodate larger extensions of shapes outside their containing dies should be obvious.

In one embodiment, the process of subdividing the circuit design into even partitions will operate on partitioning the set of dies into partitions. Step 604 may evaluate a weight to be assigned to each one of the dies. The weight for each die reflects the cost of extracting the shapes contained in this die. A die containing no shapes may have a weight of zero. Step 606 may receive a rectangular region defining an area where information for the circuit design is to be extracted. The rectangular region may be placed around the set of dies comprising the shapes to be extracted. The rectangular region may contain a grid of dies, some of which may not contain any shape.

Step 608 may receive a target number of partitions desirable for the rectangular region. Step 610 may then iteratively divide the rectangular region into a plurality of sub-regions until a sub-target number for each sub-region is one.

In one embodiment, step 612 may determine a first sub-target number and a second sub-target number, where the sum of the first and the second sub-target numbers equal the target number of partitions. For example, given a target number of partitions, step 612 may determine two sub-target numbers whose sum is the target number. These two numbers will become the target numbers for the subsequent two rectangles after the initial rectangle is split. Generally, these two numbers may be as close as possible. For example, if the initial target number is even, then the two numbers may be equal; otherwise, if the initial target number is odd, then the two numbers may differ by one.

Step 614 may divide the rectangular region into a first sub-region and a second sub-region. The first sub-region having a first weight calculated based on the weight of dies in the first sub-region, the second sub-region having a second weight calculated based on the weight of dies in the second sub-region. A ratio of the first weight to the second weight may substantially match a ratio of the first sub-target number to the second sub-target number. For example, the method may first determine the longest dimension of the rectangle, and then choose a line perpendicular to the long dimension which divides the rectangle of dies into two groups. The sum of the weights in each group of dies may be determined, and the perpendicular line may be repositioned such that the ratio of total weights from either side of the rectangular region matches the ratio of target numbers assigned for the split rectangles.

Once the perpendicular line is determined, that is, the ratio of total weights from either side of the rectangular region matches the ratio of target numbers assigned for the split rectangles, then the two sub-target numbers may be assigned to each of the two new rectangles as the target number in the iterative processing of the two new rectangles.

The iterative process may be repeated for each sub-rectangle pair until all partitions have a target number of one. Thus, step 616 may further divide the first sub-region when the first sub-target number is greater than one, and step 618 may further divide the second sub-region when the second sub-target number is greater than one.

Upon completion of the iterative process 610, step 620 may extract information for two or more sub-regions in parallel. The method 600 may produce near-square and evenly weighted partitions. In addition, it reacts to extreme dimensional conditions, tending to slice horizontally for tall thin regions, and vertically for short wide regions, and tending to keep pockets of dies to be extracted together.

It is contemplated that the dies having zero weight may be removed from the rectangles for weight calculation purposes. For example, outer rows or columns of dies in a rectangle for which every die has zero weight may be removed.

It is also contemplated that step 614 for dividing the rectangular region into a first sub-region and a second sub-region may be implemented as follows. The process may first logically rotate the rectangle so that the longer dimension is horizontal, thus the split line will be vertical. There will be columns of dies, with the number of columns equal to the number of dies along the length of the rectangle. For each column, the process may sum the weights and save the weights in an array indexed by the column number. This array may be referred to as the column weight array.

The process may then create an indexed array, referred to as the accumulated column weight array, whose contents are the sum of that column's weight and all columns to the left of it. The values of this array can be computed by scanning through the column weight array left-to-right accumulating each column's weight in a subtotal, and saving that subtotal in the accumulated column weight array at each column position. The accumulated column weight for the rightmost column is the total weight of the rectangle.

The process may determine the desired weight of the left partition by scaling the total weight with the ratio of the left target number to the total target number. The process may scan through the accumulated column weight array finding the weight that most closely matches the desired weight of the left partition, and the split line may be chosen to be to the right of this die column.

It is contemplated that after partitioning for parallel execution, it may be necessary to include surrounding dies for each partition. This is because when performing a circuit's parasitic extraction, there may be shapes within the collection of dies of a partition coupling to shapes in dies outside of the partition.

In one embodiment, the original collection of dies may be referred to as the primary dies and the surrounding dies may be referred to as secondary dies. If the MXD is less than the width of the die plus the max coupling distance (MCD, as previously described), then only the adjacent dies need to be included as secondary dies. Shapes within the primary dies may also be marked so that only those shapes may be extracted, and not shapes contained in the secondary dies. It is understood that the inclusion of shapes in the secondary dies may have a small effect on the extraction performance if the extractor is equipped to detect and skip shapes not marked to be extracted.

It is contemplated that the extraction method 600 may screen out shapes of the secondary dies that are not sufficiently close to primary die shapes. This process may be accomplished by checking each shape of the secondary dies to see if it is within MCD+MXD of a die boundary adjacent to a primary die. The screening process may be implemented by first determining which of the four die edges of the secondary die abut a primary die. Such edges may be referred to as the abutting edges. The process may then scan each shape contained in the secondary die, and for each shape contained in the secondary die, see if any edge of the shape is within MCD+MXD of any of the abutting edges. If it is, the shape may be kept; if not, the shape may be discarded.

It is contemplated that the extraction method 600 may be refined to adjust the ratio to achieve a better split grouping. For example, if the upper left and lower right corners of a region were to be extracted, it would be better to insure that the initial split isolates these two regions.

It is also contemplated that the split step of the extraction method 600 may be further refined to split into more than two regions when it is deemed beneficial. With the above process, the number of splits of a long or narrow region may likely result in a number of partitions in the long direction that is a power of two. If an optimal split number is determined, the algorithm may be adjusted to perform N evenly weighted splits instead of two.

In the present disclosure, the methods disclosed may be computer program products for extracting information for a circuit design. A computer program product may comprise a computer usable storage medium having computer usable program code stored thereon tangibly embodied therewith. Examples of computer usable storage medium having computer usable program code stored thereon include computer readable storage devices such as a recordable type medium such as a floppy disk, a hard disk drive, a Compact Disc (CD), a Digital Video Disk (DVD), a digital tape, a computer memory, conventional computer system RAM (random access memory), ROM (read only memory), EPROM (erasable, programmable ROM), EEPROM (electrically erasable, programmable ROM), flash memory, and magnetic or optical disks or tapes.

Figure 7:
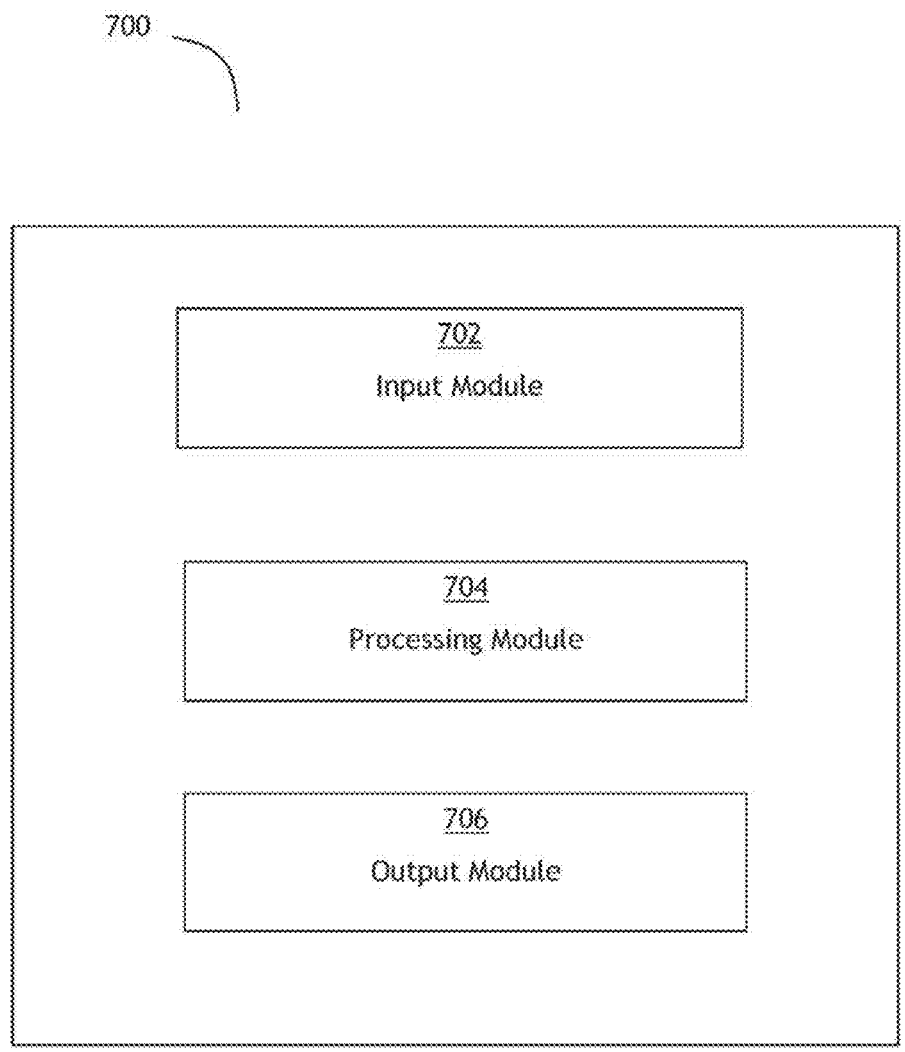
FIG. 7 is a block diagram illustrating a system for extracting information for a circuit design.

Referring to FIG. 7, a block diagram illustrating a system 700 for extracting information for a circuit design is shown. The system 700 may comprise an input module 702 configured for receiving input information (e.g., circuit design or design change information). The system 700 may also comprise a processing module 704 configured for performing various processing and/or computations. Such processing/computations may include, for example, identifying different types of shapes, partitioning for parallelization, and/or extracting information for the circuit design, etc. The system 700 may further comprise an output module 706 configured for presenting the extracted information.

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A method for extracting information for a circuit design, comprising:
dividing the circuit design into a plurality of dies;
evaluating a weight to be assigned to each one of the plurality of dies, wherein the weight of a die of the plurality of dies represents a cost of extracting one or more design shapes from the die;
receiving a rectangular region defining an area where information for the circuit design is to be extracted, wherein the information for the circuit design includes one or more electrical characteristics for the circuit design, wherein the one or more electrical characteristics comprises at least one of capacitance, resistance, and inductance;
receiving a target number of partitions desirable for the rectangular region;
iteratively dividing, by a processor, the rectangular region into a plurality of subregions until a sub-target number for each sub-region is one, comprising:
determining a first sub-target number and a second sub-target number, the sum of the first and the second sub-target numbers equal the target number of partitions;
dividing the rectangular region into a first sub-region and a second sub-region, the first sub-region having a first weight calculated based on the weight of dies in the first sub-region, the second sub-region having a second weight calculated based on the weight of dies in the second sub-region, where a ratio of the first weight to the second weight substantially matches a ratio of the first sub-target number to the second sub-target number;
further dividing the first sub-region when the first sub-target number is greater than one; and
further dividing the second sub-region when the second subtarget number is greater than one; and
extracting information for at least two sub-regions in parallel.

2. The method as claimed in claim 1, further comprising:
determining whether to include a surrounding die in a sub-region based on a proximity of the surrounding die to the dies in the sub-region.

3. The method as claimed in claim 1, further comprising:
trimming the rectangular region by removing dies having zero weight from weight calculation.

4. The method as claimed in claim 1, wherein the first subtarget number equals the second sub-target number when the target number is an even number, and the first and second sub-target numbers differ by one when the target number is an odd number.

5. The method as claimed in claim 1, wherein dividing the rectangular region into a first sub-region and a second sub-region comprises:
logically rotating the rectangular region wherein a longer dimension of the rotated rectangular region is horizontal;
calculating a column weight for each column of dies for the rotated rectangular region;
creating an indexed array for storing the column weight for each column of dies;
calculating a total weight of the rectangular region based on the column weight for each column of dies;
determining a desired weight of a first portion of the rectangular region based on the ratio of the first sub-target number to the second subtarget number; and
scanning from a first end of the rectangular region towards the second end of the rectangular region to locate a vertical dividing line wherein an accumulated column weight from the first end to the vertical dividing line most closely matches the desired weight of the first portion.

6. An apparatus comprising:
a processor;
a processing module executable on the processor, the processing module configured to, divide the circuit design into a plurality of dies;

evaluate a weight to be assigned to each one of the plurality of dies, wherein the weight of a die of the plurality of dies represents a cost of extracting one or more design shapes from the die;

receive a rectangular region defining an area where information for a circuit design is to be extracted, wherein the information for the circuit design includes one or more electrical characteristics for the circuit design, wherein the one or more electrical characteristics comprises at least one of capacitance, resistance, and inductance;

receive a target number of partitions desirable for the rectangular region;

iteratively divide the rectangular region into a plurality of subregions until a sub-target number for each sub-region is one, comprising:

determine a first sub-target number and a second sub-target number, the sum of the first and the second sub-target numbers equal the target number of partitions;

divide the rectangular region into a first sub-region and a second sub-region, the first sub-region having a first weight calculated based on the weight of dies in the first sub-region, the second sub-region having a second weight calculated based on the weight of dies in the second sub-region, where a ratio of the first weight to the second weight substantially matches a ratio of the first sub-target number to the second sub-target number;

further divide the first sub-region when the first sub-target number is greater than one; and further divide the second sub-region when the second subtarget number is greater than one; and extract information for at least two sub-regions in parallel.

7. The apparatus as claimed in claim 6, wherein the processing module is configured to, determine whether to include a surrounding die in a sub-region based on a proximity of the surrounding die to the dies in the sub-region.

8. The apparatus as claimed in claim 6, wherein the processing module is configured to, trim the rectangular region by removing dies having zero weight from weight calculation.

9. The apparatus as claimed in claim 6, wherein the first subtarget number equals the second sub-target number when the target number is an even number, and the first and second sub-target numbers differ by one when the target number is an odd number.

10. The apparatus as claimed in claim 6, wherein the processing module configured to divide the rectangular region into a first sub-region and a second sub-region comprises the processing module configured to, logically rotate the rectangular region wherein a longer dimension of the rotated rectangular region is horizontal;

calculate a column weight for each column of dies for the rotated rectangular region;

create an indexed array for storing the column weight for each column of dies;

calculate a total weight of the rectangular region based on the column weight for each column of dies;

determine a desired weight of a first portion of the rectangular region based on the ratio of the first sub-target number to the second subtarget number; and scan from a first end of the rectangular region towards the second end of the rectangular region to locate a vertical dividing line wherein an accumulated column weight from the first end to the vertical dividing line most closely matches the desired weight of the first portion.

11. A computer program product for extracting information for a circuit design, the computer program product comprising:

a non-transitory computer readable storage medium having computer usable program code embodied therewith, the computer usable program code comprising a computer usable program code configured to:

divide the circuit design into a plurality of dies;

evaluate a weight to be assigned to each one of the plurality of dies, wherein the weight of a die of the plurality of dies represents a cost of extracting one or more design shapes from the die;

receive a rectangular region defining an area where information for a circuit design is to be extracted, wherein the information for the circuit design includes one or more electrical characteristics for the circuit design, wherein the one or more electrical characteristics comprises at least one of capacitance, resistance, and inductance;

receive a target number of partitions desirable for the rectangular region;

iteratively divide the rectangular region into a plurality of subregions until a sub-target number for each sub-region is one, comprising:

determine a first sub-target number and a second sub-target number, the sum of the first and the second sub-target numbers equal the target number of partitions;

divide the rectangular region into a first sub-region and a second sub-region, the first sub-region having a first weight calculated based on the weight of dies in the first sub-region, the second sub-region having a second weight calculated based on the weight of dies in the second sub-region, where a ratio of the first weight to the second weight substantially matches a ratio of the first sub-target number to the second sub-target number;

further divide the first sub-region when the first sub-target number is greater than one; and further divide the second sub-region when the second subtarget number is greater than one; and extract information for at least two sub-regions in parallel.

12. The computer program product as claimed in claim 11, wherein the computer usable program code is configured to, determine whether to include a surrounding die in a sub-region based on a proximity of the surrounding die to the dies in the sub-region.

13. The computer program product as claimed in claim 11, wherein the computer usable program code is configured to, trim the rectangular region by removing dies having zero weight from weight calculation.

14. The computer program product as claimed in claim 11, wherein the first subtarget number equals the second sub-target number when the target number is an even number, and the first and second sub-target numbers differ by one when the target number is an odd number.

15. The computer program product as claimed in claim 11, wherein the computer usable program code configured to divide the rectangular region into a first sub-region and a second sub-region comprises the computer usable program code configured to, logically rotate the rectangular region wherein a longer dimension of the rotated rectangular region is horizontal;

calculate a column weight for each column of dies for the rotated rectangular region;
create an indexed array for storing the column weight for each column of dies;
calculate a total weight of the rectangular region based on the column weight for each column of dies;
determine a desired weight of a first portion of the rectangular region based on the ratio of the first sub-target number to the second subtarget number; and
scan from a first end of the rectangular region towards the second end of the rectangular region to locate a vertical dividing line wherein an accumulated column weight from the first end to the vertical dividing line most closely matches the desired weight of the first portion.

* * * * *